United States Patent [19]

Fox

[11] Patent Number: 4,617,521

[45] Date of Patent: Oct. 14, 1986

[54] SAMPLE AND HOLD DEMODULATOR WITH FEEDBACK FOR REDUCED RIFFLE

[75] Inventor: Ronald W. Fox, Edinburgh, Scotland

[73] Assignee: Ferranti plc, Cheshire, England

[21] Appl. No.: 741,263

[22] Filed: Jun. 4, 1985

[30] Foreign Application Priority Data

Jun. 22, 1984 [GB] United Kingdom ............... 8416017

[51] Int. Cl.⁴ ............................................. H03D 3/18
[52] U.S. Cl. ....................................................... 329/50
[58] Field of Search ................. 329/50, 104, 105, 126, 329/168; 375/94, 118; 475/337

[56] References Cited

U.S. PATENT DOCUMENTS 4,393,352  7/1983  Volpe et al. ........................... 329/50
4,426,623  1/1984  Wilkens et al. .................. 329/104 X Primary Examiner—Eugene R. LaRoche
Assistant Examiner—D. C. Mis
Attorney, Agent, or Firm—Kerkam, Stowell, Kondracki & Clarke

[57] ABSTRACT

A demodulator circuit comprises an integrator (A1) having its input connected through a first switch (S1) to a summing point (P). A modulated carrier signal to be demodulated is applied to the summing point through an input resistor (R1). A sample-and-hold circuit comprises a second switch (S2) operable at the carrier signal frequency in antiphase with the first switch (S1) to connect the output of the integrator (A1) to a holding capacitor (C2) and an operational amplifier (A2) having 100% negative feedback. A feedback connection including a feedback resistor (R2) is connected between the output of the amplifier (A2) and the summing point (P).

6 Claims, 6 Drawing Figures

SAMPLE AND HOLD DEMODULATOR WITH FEEDBACK FOR REDUCED RIFFLE

Many types of demodulator circuit are known for recovering information carried by a modulated carrier signal. The type of circuit used in any particular application is usually a compromise between the confllcting requirements of speed of response, discrimination against noise, attenuation and phase shift and other factors.

One common type of demodulator is the sampling demodulator. This functions by sampling the instantaneous amplitude of the modulated carrier waveform at some fixed point in the carrier cycle and holds this value until a new sample is taken in the next cycle. Such a demodulation therefore responds to any changes only one cycle later, which is a desirable feature. However, such a demodulator does not discriminate against any noise which may be present on the modulated carrier when the sample is taken. Such noise is usually independent of the carrier amplitude, and large noise levels may therefore exist at low modulation levels of the carrier.

An alternative type of demodulator which is much used is the averaging demodulator. This performs phase-sensitive rectification of the modulated carrier signal, followed by smoothing. Whilst this will discriminate against noise, the speed of response is clearly much slower than that of the sampling demodulator. In addition, there are attenuation and phase shift problems and ripple is present on the output. Clearly a compromise has to be reached between these various problems.

A third common demodulator circuit is the peak reading circuit. This also uses phase-sensitive rectification, and holds the peak values on a parallel resistor-capacitor network. Whilst the response of such a circuit to signals of increasing amplitude is fast, the response is slower if the signal is decreasing, dependent upon the time constant of the RC network. The problems of attenuation, phase-shift and output ripple are again present.

It is an object of the invention to provide a demodulator circuit which has a rapid response and measures true average value without any of the disadvantages referred to above.

According to the present invention there is provided a demodulator circuit which includes an integrator having its input connected through a first switch to a summing point to which may be applied a modulated carrier signal, a sample-and-hold circuit comprising a second switch operable at the carrier signal frequency in antiphase with the first switch to connect the output of the integrator to a holding capacitor connected to the input of an operational amplifier having 100% negative feedback, and a feedback connection between the output of the sample-and-hold circuit and the summing point.

An embodiment of the invention will now be described with reference to the accompanying drawings, in which.

Figure 1:
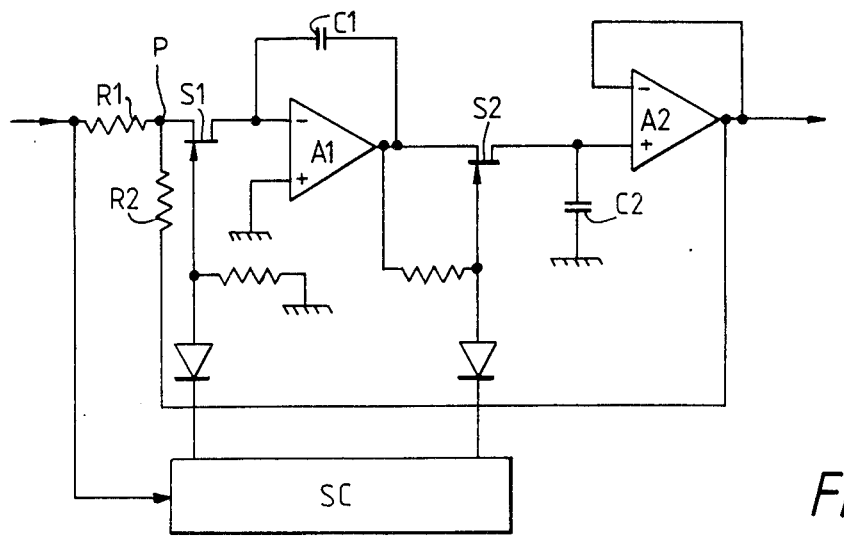
FIG. 1 is a schematic circuit diagram of one form of demodulator.

Referring now to FIG. 1, the modulated carrier input signal is applied by way of an input resistor R1 to a summing point P. This summing point is connected by way of a first switch S1, here shown as an FET switch, to the input of an integrator. The integrator comprises an operational amplifier A1 having the input applied to its inverting input and a capacitor C1 connected between the output of the amplifier A1 and its inverting input.

The output of the integrator is connected by way of a second switch S2, also shown as an FET switch, to a sample-and-hold circuit comprising a holding capacitor C2 and an operational amplifier A2. The capacitor is connected to the non-inverting input of the amplifier A2 whilst 100% feedback is applied between the output of amplifier A2 and its inverting input.

A feedback connection including a feedback resistor R2 is connected between the output of the operational amplifier A2 and the summing point P.

The rest of the circuitry shown in FIG. 1 is concerned with the operation of the switches S1 and S2. These operate in antiphase, that is one is open whilst the other is closed. The switches are operated by square-wave signals derived from the carrier of the modulated input signal so that switching occurs at the zero crossing points of the carrier. If only one type of FET switch is used as shown, either n-channel or p-channel, then two antiphase switching waveforms must be produced by the switch control circuit SC. The circuit will also include a limiter circuit to derive a constant amplitude alternating signal from the input signal. If opposite types of FET are used then only a single switching waveform will be necessary.

Figure 2A:
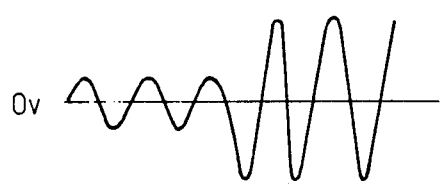
FIG. 2a-2e illustrates various signal waveforms occuring during the operation of the circuit.

The operation of the demodulator will now be described with reference also to the waveforms shown in FIGS. 2a-2e. FIG. 2a shows an input signal comprising a carrier to which a step function modulating signal is applied. It will be assumed for the purpose of the following description that switch S1 is closed during the negative half-cycles of the carrier frequency.

Figure 2B:
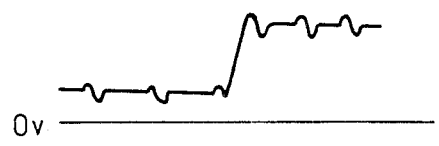

The input and feedback resistors R1 and R2, amplifier A1 and integrating capacitor C1 form a near-perfect integrator having a time constant of $RC\frac{1}{2}$ if the two resistors are of equal value. This is made to be approximately equal to half the period of the carrier frequency. Amplifier A1 integrates the combined effect of the negative half-cycle of the input signal and whatever d.c. level is fed back from the output of amplifier A2. At the end of the half-cycle there will be an output voltage at the output of the integrator, and FIG. 2b shows the form that this takes over a number of cycles.

When switch S1 opens the voltage at the output of the integrator is held, and is transferred to capacitor C2 when switch S2 closes. The output impedance of amplifier A1 is low, and hence the transfer of voltage to capacitor C2 wll be completed well within the period during which switch S2 is closed. The output of amplifier A2 develops a voltage dependent upon upon the voltage on capacitor C2, and this voltage is applied to the summing point P.

When switch S1 is again closed the combined effect of the input waveform and a new d.c. level from amplifier A2 wll be integrated. The negative feedback from amplifier A2 to the summing point allows the circuit to adjust the feedback voltage so that over a number of cycles the net d.c. input at the summing junction is zero. Clearly the a.c. components of the sm of the two voltages at the summing point cannot be zero, so that there will be a.c. components superimposed on the d.c. level of the integrator output as shown in FIG. 2b. However, the important fact is that, over a period of time, a d.c. null is obtained at the summing point. This means that the fed-back d.c. level from the output of amplifier A2 must be equal in magnitude and opposite in sign to the d.c. content of the modulated input signal. Hence the d.c. voltage obtained at the output of the amplifier A2, and shown in FIG. 2c, must be equal to the time average value of the input waveform over half a cycle of that waveform.

Figure 2C:
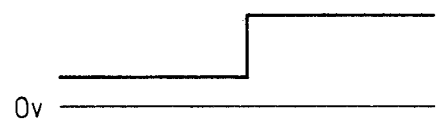
Figure 2D:
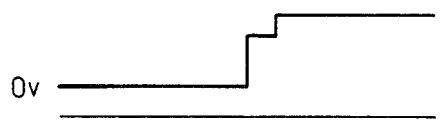
Figure 2E:
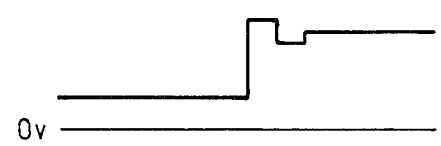

The output signal is obtained in the form shown in FIG. 2c only if the time constant of the integrator is equal to one half of the carrier signal period. If the time constant is increased then the output signal will be overdamped, as shown in FIG 2d, whilst if the time constant is increased then the output signal will be underdamped, as shown in FIG. 2e.

It will have been noted that the demodulator is ripple-free. The more usual form of averaging demodulator would produce an output with a ripple content for the same response time of up to 60% or more. The overall loop gain of the demodulator shown in FIG. 1 is unity, since the input and feedback resistors R1 and R2 are of the same value. It is possible to increase the gain to a reasonable extent, say up to 10 or 20, by increasing the feedback resistor R2 by an appropriate amount.

The switch control circuit SC has not been described in detail. The function of the circuit has been described, however, and circuits of different types may be used to provide the necessary switching signals from the input signal.

What we claim is:

1. A demodulator circuit which includes an integrator having an input connected through a first switch to a summing point to which may be applied a modulated carrier signal, a sample-and-hold circuit comprising a second switch operable at the carrier signal frequency in antiphase with the first switch to connect an output of the integrator to a holding capacitor connected to an input of an operational amplifier having 100% negative feedback, and a feedback connection between the output of the sample-and-hold circuit and the summing point.

2. A circuit as claimed in claim 1 which includes a switch control circuit operable to derive from the modulated carrier signal at least one switch control signal for controlling the operation of the first and second switches.

3. A circuit as claimed in claim 2 in which each of the first and second switches is a semiconductor device.

4. A circuit as claimed in claim 1 in which the modulated carrier signal is connected to the summing point by way of an input resistor and the said feedback connection includes a feedback resistor.

5. A circuit as claimed in claim 4 in which the input resistor and the feedback resistor are of equal value.

6. A circuit as claimed in claim 1 in which the time constant of the integrator is equal to half the period of the carrier signal.

* * * * *